United States Patent [19]

Iwase

[11] Patent Number: 5,305,284
[45] Date of Patent: Apr. 19, 1994

[54] SEMICONDUCTOR MEMORY DEVICE

[75] Inventor: Taira Iwase, Kawasaki, Japan

[73] Assignee: Kabushiki Kaisha Toshiba, Kawasaki, Japan

[21] Appl. No.: 979,054

[22] Filed: Nov. 19, 1992

[30] Foreign Application Priority Data

Nov. 21, 1991 [JP] Japan ................. 3-305971

[51] Int. Cl.$^5$ .............................. G11C 8/00
[52] U.S. Cl. .................. 365/238.5; 365/189.05; 365/233.5
[58] Field of Search ............ 365/238.5, 189.05, 239, 365/233.5

[56] References Cited

U.S. PATENT DOCUMENTS

| | | | |
|---|---|---|---|
| 4,567,579 | 1/1986 | Patel ..................... | 365/189.05 |
| 5,088,062 | 2/1992 | Shikata ................. | 365/238.5 |
| 5,134,583 | 7/1992 | Matsuo ................. | 365/238.5 |
| 5,214,609 | 5/1993 | Kato ..................... | 365/189.05 |

*Primary Examiner*—Eugene R. LaRoche
*Assistant Examiner*—A. Zarabian
*Attorney, Agent, or Firm*—Banner, Birch, McKie and Beckett

[57] ABSTRACT

A semiconductor memory having a page mode includes a first circuit for reading out page data from a memory cell array, in accordance with cell address signals A3-A19, and a second circuit for latching, at the beginning of a page mode cycle, page data to be read out in the cycle, sequentially outputting the latched data in page address signals A0-A2, and inputting to the first circuit an address from which to read out page data to be output in a following page mode cycle. By provision of the first and second circuits, the period of time from a change in address to output of read-out data can be shortened considerably, permitting high-speed reading in the page mode.

6 Claims, 4 Drawing Sheets

SEMICONDUCTOR MEMORY DEVICE

BACKGROUND OF THE INVENTION

1. Field of the Invention

The present invention relates to a semiconductor memory device having a page mode, and more particularly, to a method for reading data in the page mode.

2. Description of the Related Art

When a conventional semiconductor device is operating in a page mode, a cell address is designated, and data are read out in parallel from a cell of a memory cell array which corresponds to the address designated, and are supplied to a plurality of sense amplifiers. By changing the page address, data can be read out sequentially from the sense amplifiers and supplied in sequence to an output terminal via an output buffer.

FIG. 1 is a chart showing the timing of a reading operation of a conventional mask ROM (Read Only Memory) in an 8-bit page mode. Of address signals A0-A19 shown in FIG. 1, signals A0-A2 are used as page address signals, and signals A3-A19 are used as cell address signals indicating address A of a memory cell storing the eight data to be read out from the memory cell array. Upon input of the address signals A0-A19, the eight data are read out in parallel from the cell, and are supplied to the sense amplifiers. One of the eight data read out is designated by the page address signals A0-A2, and is supplied to the output terminal via the output buffer. By changing the page address (A0-A2), the remaining seven data are sequentially selected and supplied to the output terminal via the output buffer. In the case where new eight data are read out from a cell of address B, the content of the address signals A0-A19 is changed, as a result of which the eight data are read out in parallel from the cell of address B and are supplied to the sense amplifiers. One of the eight data is designated by the page address signals A0-A2, and is output to the output terminal via the output buffer. By changing the page address (A0-A2), the remaining seven data are sequentially selected and supplied to the output terminal via the output buffer.

In the case of a data reading method such as that described above, output data Dout is in an unspecified state during the period of time (marked XXXX in FIG. 1) from a change in the cell address (A3-A19) to a change in the page address (A0-A2). In short, reading of data is not performed during this period, preventing high-speed reading in the page mode.

In the page mode of a conventional semiconductor device, as explained above, reading of data is not performed during the period of time from a change in the cell address to output of read-out data, preventing high-speed reading from being attained.

SUMMARY OF THE INVENTION

The present invention has been devised in view of the above-described drawback of the conventional memory device, and the object thereof is to provide a semiconductor memory device wherein the period of time from a change in the cell address to output of read-out data can be shortened, thus permitting high-speed reading in the page mode.

According to the present invention, when page switching is performed in a semiconductor memory device in a page mode, so as to read out page data successively, the page data to be read out in each of page mode cycles are latched at the beginning of the cycle, and thereafter are output sequentially in accordance with page address signals, simultaneous with which cell address signals are input such that the page data to be output in the next page mode cycle are read out and supplied to the sense amplifiers. By using this technique, the period of time from a change in the cell address to output of read-out data is shortened considerably, thus permitting high-speed reading in the page mode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENT

An embodiment of the present invention will now be described in detail, with reference to the drawings.

Figure 1:
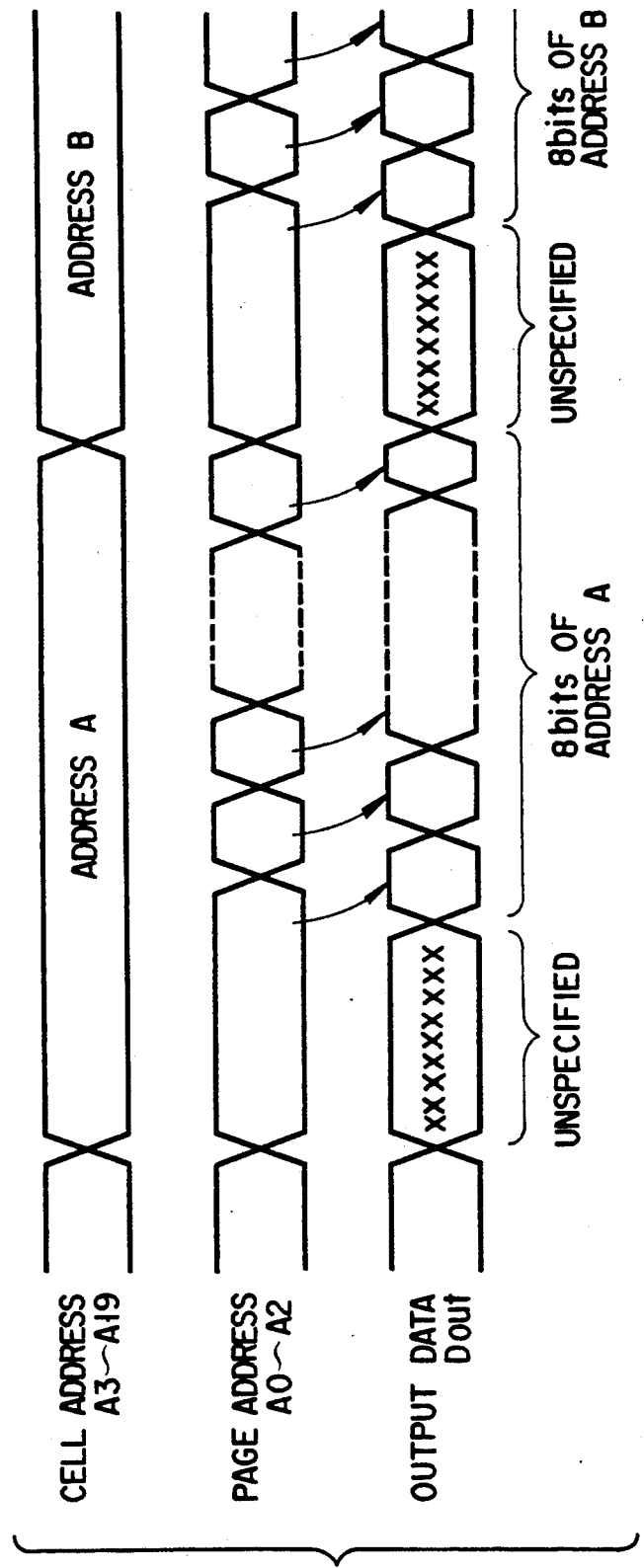
FIG. 1 is a circuit diagram showing a conventional semiconductor memory.
Figure 2:
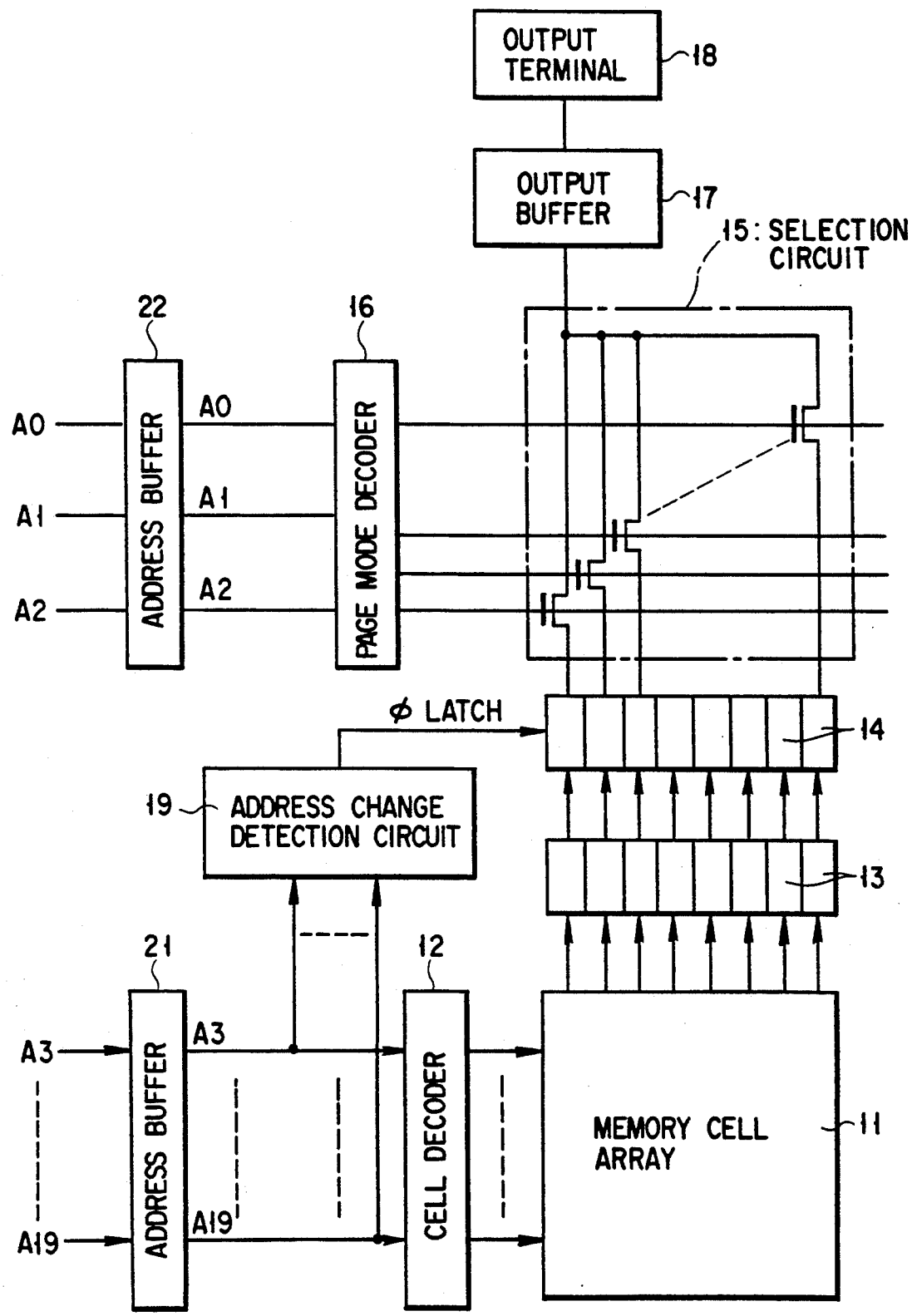
FIG. 2 is a circuit diagram showing the semiconductor memory according to one embodiment of the present invention.

FIG. 2 shows a part of the mask ROM according to one embodiment of the present invention and having an 8-bit page mode. Reference numerals 11 and 12 respectively denote a memory cell array and a decoder for selecting a cell of the memory cell array 11 in accordance with an address indicated by cell address signals A3-A19, so that page data can be read out therefrom. Reference numeral 13 denotes a group of sense amplifiers for sensing the page data read out from the memory cell array 11, reference numeral 14 denotes a group of latch circuits for latching the page data output from the sense amplifiers 13, reference numeral 15 represents a group of selection circuits for sequentially selecting the data latched by the latch circuits 14, reference numeral 16 denotes a page mode decoder for sequentially selecting the selection circuits 15 in accordance with page address signals A0-A2, and reference numeral 17 denotes an output buffer for outputting the latched data selected by the selection circuits 15 to an output terminal 18. Reference numerals 21 and 22 denote address buffers. The group of selection circuits 15 includes a plurality of MOS transistors provided one for each of the latch circuits 14.

The latch circuits 14 of the present invention perform latching operations at the beginning of each page mode cycle, and during which the page address (A0-A2) is changed, and the cell address from which to read out the data to be output in the next page mode cycle is input to the decoder 12. In order to realize this operation mode, an address change detection circuit 19 is employed for detecting a change in the cell address (A3-A19), and a latch signal φ LATCH is supplied from the address detection circuit 19 to the latch circuits 14.

The semiconductor memory of the present invention is a 16M-bit mask ROM (1M words×16 bits), for example, and comprises sixteen units, each including a memory cell array 11, a group of sense amplifiers 14, a group of latch circuits 14, a group of selection circuits 16, an output buffer 17, and an output terminal 18.

Figure 3:
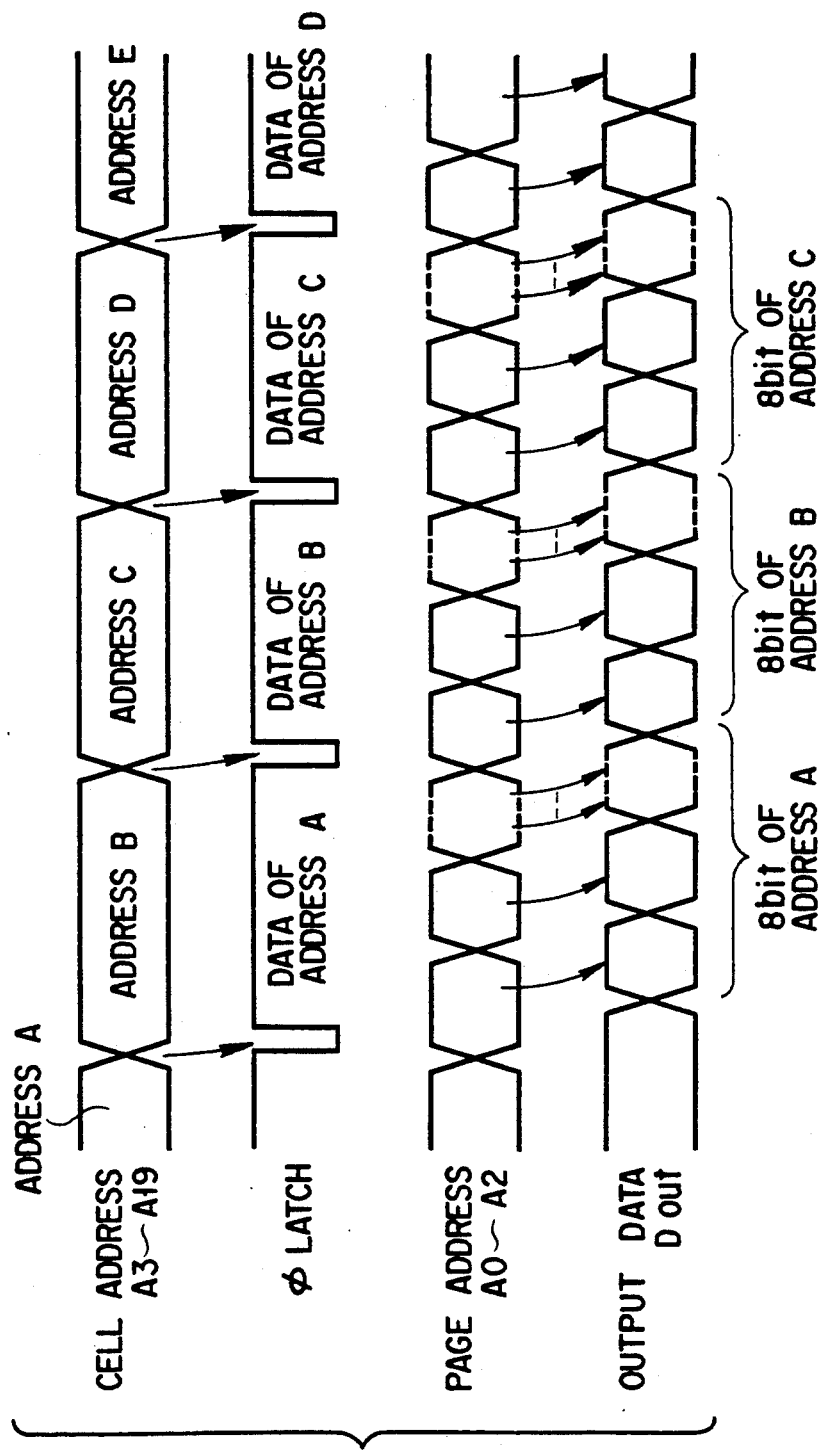
FIG. 3 is a timing chart showing an operation performed by the memory shown in FIG. 2.

FIG. 3 is a chart showing the timing of a reading operation performed by the above-described mask ROM in the page mode, when page switching is performed so as to read page data successively.

In a first page mode cycle in the page mode, the cell address (A3-A19) from which data is to be read out to be output in the next page mode cycle is designated. More specifically, the cell address signals A3-A19 are externally input to the memory cell array 11 via the input buffer 21 and the cell decoder 12. The cell address signals A3-A19 are decoded by the cell decoder 12, and eight data are read out in parallel from a cell having the address designated by the cell address signals A3-A19, and are supplied to the sense amplifiers 13. The address designated by the cell address signals A3-A19 is represented by A. In a second page mode cycle, the cell address signals A3-A19 are changed so as to designate address B in the memory cell array 11, and the data to be output in the next page mode cycle are read out from a cell having address B. When the cell address designated by the cell address signals A3-A19 is changed to address B, the address change detection circuit 19 detects a change in the cell address, and generates a latch signal φ LATCH as a result. The latch signal thus generated is input to the latch circuits 14, in response to which the circuits 14 latch the page data of address A which are to be read out in the second page mode cycle. Simultaneous with designation of the cell address (A3-A19), the page address (A0-A2) is also designated. To be more specific, the page address signals A0-A2 are externally input to the section circuits via the input buffer 22 and the page mode decoder 16. The page address signals A0-A2 are decoded by the page mode decoder 16, and one of the selection transistors included in the selection circuits 15 is designated by an output from the decoder 16 and turned on, with the result that one of the latched data of address A is output from the group of selection circuits 15. Then, the page address (A0-A2) is changed such that the remaining seven latched data of address A are sequentially selected and output to the output terminal 18 via the output buffer 17. The operation as performed in the second page mode cycle is performed again in a third page mode cycle et seq..

If, in the second page mode cycle, output of the latched data of address A is completed before reading out of the page data of address B, the latched data of address B can be sequentially output in the third page mode cycle.

Figure 4:
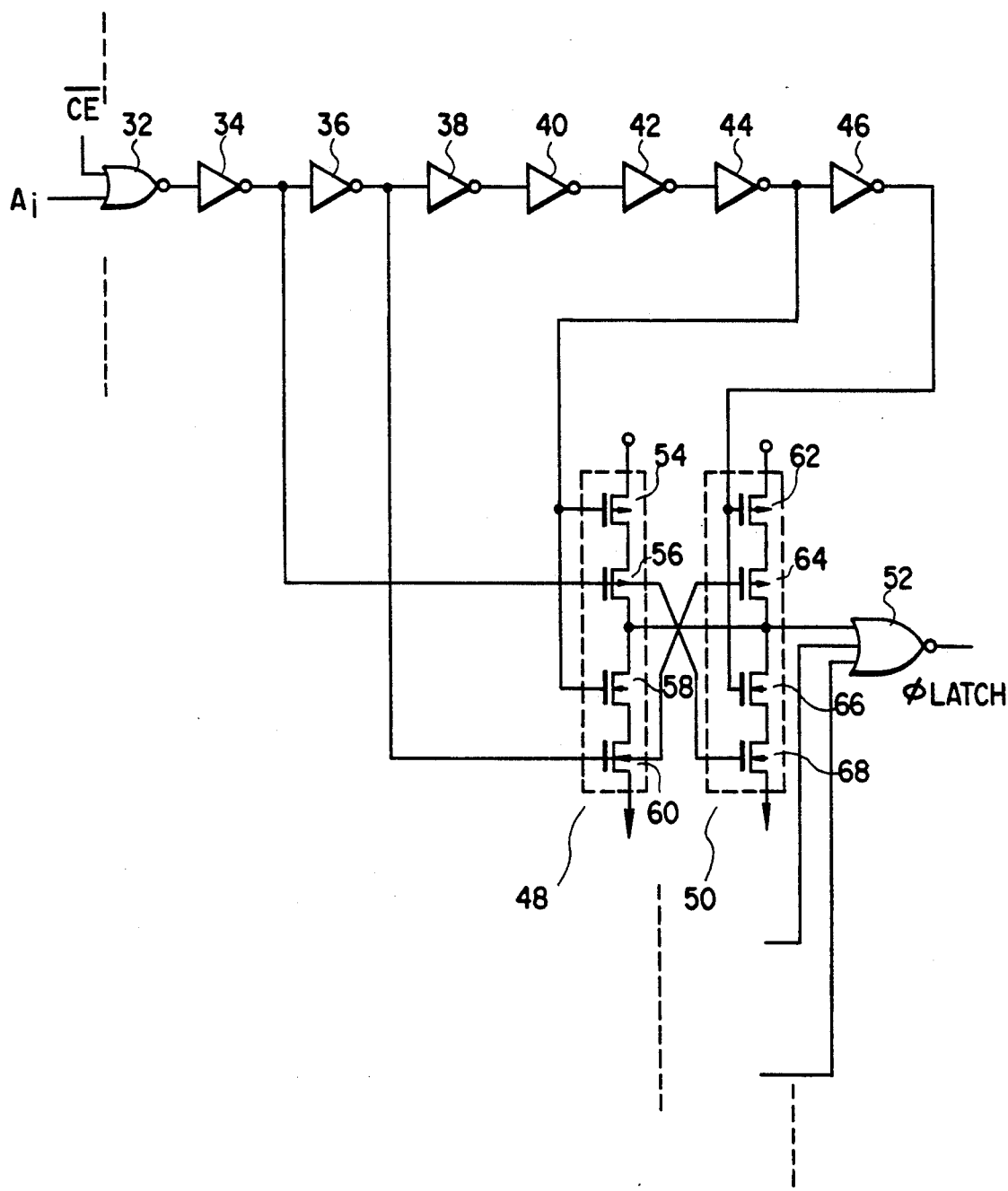
FIG. 4 is a diagram showing an address change detection circuit of the semiconductor memory shown in FIG. 2.

FIG. 4 shows a circuit diagram of the address change detection circuit used in the semiconductor memory shown in FIG. 2. Reference character Ai denotes the cell address signals A3-A19, and a given cell address signal Ai (i=3 to 19) is supplied to that part of the address detection circuit which is shown in FIG. 4.

The circuit shown in FIG. 4 has a two-input NOR gate 32, seven inverters, 34, 36, 38, 40, 42, 44, and 64, which sequentially receive an output of the NOR gate 32, two CMOS inverters, 48 and 50, and a NOR gate 52 which receives outputs of the CMOS inverters 48 and 50. The CMOS inverter 48 includes two P-channel transistors, 54 and 56, and two N-channel transistors, 58 and 60, while the CMOS inverter 50 includes two P-channel transistors, 62 and 64, and two N-channel transistors, 66 and 68. One of the input terminals of the two-input NOR gate 32 receives the cell address signal Ai (i=3 to 19), and the other input terminal thereof receives a chip enable signal $\overline{CE}$. The output of the NOR gate 32 is transferred sequentially through the seven inverters, 34, 36, 38, 40, 42, 44, and 46. The outputs of the first, second, sixth, and seventh inverters, 34, 36, 44, and 46, are input to the CMOS inverters 48 and 50. The outputs of the CMOS inverters 48 and 50 are supplied through the same line to the NOR gate 52 (these outputs are hereinafter referred to as the common output of the inverters 48 and 50), and a φ LATCH is output from the gate 52.

In the address change detection circuit described above, the delay time corresponding to four transistors, 38, 40, 42, and 44 (the third to sixth inverters), determines the pulse width of the φ LATCH. More specifically, when the cell address Ai is changed, the level of the output from the NOR gate 32 varies, causing changes in the levels of the outputs from the inverters 34 and 36, as a result of which a variation occurs in the level of the common output of the MOS inverter 48 and 50, thus changing the level of the φ LATCH output from the NOR gate 52 to a low level. A variation in the level of the output from the NOR gate 32 is communicated to the inverter 46 sequentially through the inverters 34 and 36 and the four inverters, 38, 40, 42, and 44. After the delay time corresponding to the four inverters, 38, 40, 42, and 44, the output of the inverter 46 is inverted such that a variation occurs in the level of the output from the MOS inverters 48 and 50, thus changing the level of the φ LATCH output from the NOR gate 52 to a high level. In short, a φ LATCH having a pulse width determined by the delay time corresponding to the four inverters, 38, 40, 42, and 44, is generated at the time of a change in the cell address, indicating that the address change is detected.

According to the above embodiment, when page switching is performed so as to read out page data successively in the page mode, the page data to be read out in each of the page mode cycles are latched at the beginning of the cycle, after which the latched data are sequentially output in accordance with the page address, simultaneous with which a cell address is input such that the page data to be output in the next page mode cycle are read out from the memory cell array. As a result, the period of time from a change in the address to output of read-out data can be shortened considerably, thus permitting high-speed reading in the page mode.

When the access time in a normal mode and that in the page mode are respectively 150 ns and 30 ns, for example, the time required for outputting eight data is 360 ns (150+30×7) in the case of a conventional semiconductor memory device. In contrast, in the above embodiment, the time required for outputting eight data is only 240 ns (30×8), which is one-third less than the conventional device.

According to the aforementioned embodiment, the latch signal φ LATCH is supplied from the address change detection circuit 19. However, the latch signal φ

LATCH may be input from an external terminal (not shown).

In the case of reading page data successively, when the page data read out one cycle ahead are output as described above, the semiconductor memory is limited in its use. In order to avoid this and reduce the time required for testing semiconductor memory devices and which becomes long in accordance with an improvement in the memory capacity, a method of outputting the page data read out one cycle ahead may be practiced only at the time of testing the semiconductor memory devices manufactured. In this case, the latch signal φ LATCH is input from a test pad (not shown) provided on a chip, not from the latch circuits 14, under which condition the same operation as that in a conventional page mode is performed.

The present invention is not limited to the mask ROM described in the above embodiment, and can be applied to various types of semiconductor memories.

As explained above, according to the semiconductor memory device of the present invention, when page switching is performed so as to read out the page data successively, the period of time from a change in the cell address to output of read-out data can be shortened considerably, thus permitting high-speed reading in the page mode.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory device comprising:
   a first circuit for reading out page data from a cell of a memory cell array, in accordance with an address indicated by cell address signals; and
   a second circuit for latching, at the beginning of a page mode cycle, first page data to be read out in the cycle, sequentially outputting the latched data in accordance with page address signals, and inputting to the first circuit an address from which to read out second page data to be output in a following page mode cycle.

2. A semiconductor memory device comprising:
   a memory cell array;
   a cell decoder connected to inputs of the memory cell array, said cell decoder for selecting a cell of the memory cell array from which page data are to be read out, in accordance with an address indicated by cell address signals; p1 a sense amplifier group connected to outputs of the memory cell array, said sense amplifier group comprising a plurality of sense amplifiers for sensing the page data read out from the memory cell array;
   a latch circuit group connected to outputs of the sense amplifier group, said latch circuit group comprising a plurality of latch circuits for latching, in response to input of a latch signal, the page data output from the sense amplifier group;
   a selection group connected to outputs of said latch circuit group, said selection group comprising a plurality of selection circuits for selecting the data latched by the latch circuit group;
   a page mode decoder connected to inputs of said selection group, said page mode decoder for sequentially selecting the plurality of selection circuits in accordance with page address signals;
   an output buffer circuit connected to an output of said selection group, said output buffer circuit for supplying an output of a selected one of the plurality of selection circuits to an output terminal; and
   a circuit for supplying said latch signal at the beginning of a page mode cycle, changing said address during the page mode cycle, and inputting to the cell decoder an address from which to read out data to be output in a following page mode cycle, wherein an output of said circuit for supplying said latch signal is an input to said latch circuit group.

3. The semiconductor memory device according to claim 1, wherein said latch signal is supplied from an address change detection circuit for detecting changes in said cell address signals.

4. The semiconductor memory device according to claim 2, wherein said latch signal is supplied from an address change detection circuit for detecting changes in said cell address signals.

5. The semiconductor memory device according to claim 1, wherein said latch signal is input from an external terminal.

6. The semiconductor memory device according to claim 2, wherein said latch signal is input from an external terminal.

* * * * *